(12) United States Patent
Kaufmann

(10) Patent No.: US 6,856,012 B2
(45) Date of Patent: Feb. 15, 2005

(54) CONTACT SYSTEM

(75) Inventor: Stefan Kaufmann, Aarau (CH)

(73) Assignee: ABB Schweiz AG, Baden (CH)

(*) Notice: Subject to any disclaimer, the term of this patent is extended or adjusted under 35 U.S.C. 154(b) by 0 days.

(21) Appl. No.: 10/479,216

(22) PCT Filed: May 30, 2002

(86) PCT No.: PCT/CH02/00284
§ 371 (c)(1),
(2), (4) Date: Dec. 1, 2003

(87) PCT Pub. No.: WO02/097885
PCT Pub. Date: Dec. 5, 2002

(65) Prior Publication Data
US 2004/0145050 A1 Jul. 29, 2004

(30) Foreign Application Priority Data
Jun. 1, 2001 (EP) .............................. 01113344

(51) Int. Cl.$^7$ ................... H01L 23/48; H01L 23/52; H01L 23/34
(52) U.S. Cl. ............. 257/690; 257/692; 257/693; 257/718; 257/719; 257/730; 257/731; 257/177
(58) Field of Search ................ 257/690, 692, 257/693, 718, 719, 730, 731, 177

(56) References Cited

U.S. PATENT DOCUMENTS

| | | | |
|---|---|---|---|
| 4,710,795 A | 12/1987 | Nippert et al. | |
| 4,748,495 A * | 5/1988 | Kucharek | 257/713 |
| 5,579,217 A | 11/1996 | Deam et al. | |
| 5,705,853 A | 1/1998 | Faller et al. | |
| 6,313,598 B1 * | 11/2001 | Tamba et al. | 318/722 |

FOREIGN PATENT DOCUMENTS

| | | |
|---|---|---|
| DE | 196 03 224 | 7/1997 |
| EP | 0 772 235 | 5/1997 |

OTHER PUBLICATIONS

International Preliminary Examination Report dated Feb. 4, 2003.

* cited by examiner

Primary Examiner—Nitin Parekh
(74) Attorney, Agent, or Firm—Burns, Doane, Swecker & Mathis, L.L.P.

(57) ABSTRACT

The power semiconductor includes a module housing having a conductive cover plate and a conductive baseplate and also an insulating housing wall arranged between the cover plate and the baseplate. A power semiconductor circuit is accommodated in the module housing. Two terminals of the power semiconductor circuit are led out of the module housing, a first of the at least two terminals being provided for the contact connection of the cover plate. The two terminals are arranged on opposite areas of a printed circuit board led out of the module housing, which printed circuit board can be contact-connected by means of a standard connector. The power semiconductor module according to the invention has improved contacts with regard to stability and inductance.

4 Claims, 3 Drawing Sheets

CONTACT SYSTEM

TECHNICAL FIELD

The invention relates to the field of power electronics. It is based on a power semiconductor module in accordance with the preamble of patent claim 1.

PRIOR ART

So-called "hockey puck" semiconductor modules are semiconductor modules which are used for example in a stack comprising a plurality of modules, the modules generally having the form of a hockey puck, i.e. essentially cylindrical with two parallel opposite base areas. The base areas are formed in electrically conductive fashion and connected to the power or main electrodes (emitter, collector) of the semiconductors, while the side wall between the base areas is formed in electrically insulating fashion. In a stack with a plurality of series-connected modules, a heat sink is in each case arranged between two respective modules, in the main current path. For the control and monitoring of the power semiconductor elements, a control terminal (gate) and an auxiliary terminal (auxiliary emitter) are in each case led out of the module housing. In the case of conventional "hockey puck" modules, said terminals comprise projecting pins, the auxiliary terminal being soldered onto one base area (emitter).

These pins can easily break off under the action of force. The soldering point can likewise be damaged. In addition, the inductance between the pin-like contacts is relatively high.

EP 0 772 235 discloses a semiconductor module comprising a semiconductor circuit composed of IGBTs in an electrically insulated housing. Connected to the main electrodes of the IGBTs are two power terminals which are led out of the module housing through a side wall. The power terminals are essentially formed as planar plates which are arranged parallel to one another in a manner isolated by an insulating layer. A control terminal of the IGBTs is led out of the module through the side wall at another location.

BRIEF SUMMARY OF THE INVENTION

The object of the invention is to provide a power semiconductor module of the type mentioned in the introduction which is improved with regard to the stability of the contacts and the inductance between the contacts.

This object is achieved by means of a power semiconductor module having the features of patent claim 1.

The core of the invention is that the two terminals of the power semiconductor circuit which are led out of the module housing are arranged on opposite areas of a printed circuit board (PCB) which is led out of the module housing, and that the printed circuit board is fixed to the cover plate by fixing means in a force-locking manner, so that the cover plate terminal arranged between the printed circuit board and the cover plate is electrically conductively connected to the cover plate, the fixing means advantageously being arranged in the region of the connection location.

As a result, the terminals have increased stability in conjunction with lower inductance. Furthermore, an optimum electrical connection between the cover plate and the cover plate terminal is ensured.

The cover plate and/or the cover plate terminal advantageously have a knurl in the region of the connection location. As a result, the electrical connection is additionally improved. A more reliable electrical contact over a longer time can thus be achieved even under variable conditions (temperature, moisture).

In a further preferred embodiment of the power semiconductor module according to the invention, the cover plate and the printed circuit board each have at least two projections. A respective projection of the cover plate and of the printed circuit board are arranged one above the other and the fixing means are arranged in the region of the projections. In addition, the printed circuit board has at least one further projection between the two projections.

The two projections of the cover plate ensure that the further projection of the printed circuit board is protected from impacts. Said projection is advantageously formed in an essentially rectangular fashion in order that it can be contact-connected by means of a conventional connector.

BRIEF DESCRIPTION OF THE DRAWINGS

A detailed description of the invention is given below on the basis of exemplary embodiments illustrated in the drawings, in which.

WAY OF EMBODYING THE INVENTION

In all the figures, identical reference symbols relate to identically acting parts.

Figure 1:
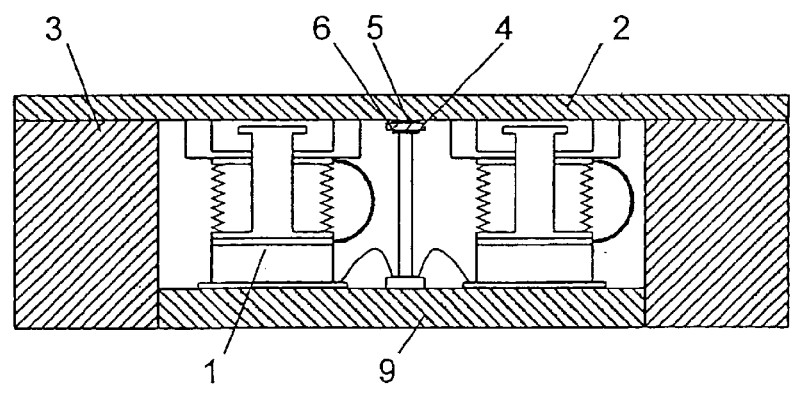
FIG. 1 shows, in a diagrammatic illustration, a power semiconductor module according to the invention, with a cover plate and a printed circuit board.

The power semiconductor module in FIG. 1 comprises a power semiconductor circuit 1 composed of two power semiconductors. The function and the construction of the power semiconductor circuit are arbitrary and not relevant to the invention. Thus, by way of example, a plurality of semiconductor elements may be combined in submodules that can be prefabricated.

The power semiconductor circuit 1 is accommodated in a module housing essentially comprising an electrically conductive cover plate 2, an electrically conductive baseplate 9 and electrically insulating housing walls 3 arranged in between.

Power or main terminals of the power semiconductor circuit 1 are electrically conductively connected to the conductive cover plate and baseplate as in the case of conventional "hockey puck" modules.

Control signals for the power semiconductors, for example gate control signals for an insulated gate bipolar transistor (IGBT) are passed from the housing via a busbar and a control terminal conductor 6.

According to the invention, the control terminal conductor 6 is arranged on one side of a printed circuit board 4 that is metallized on both sides. Situated on the other side of the printed circuit board is the cover plate terminal conductor 5, which is electrically conductively connected to the cover plate 2.

Figure 2:
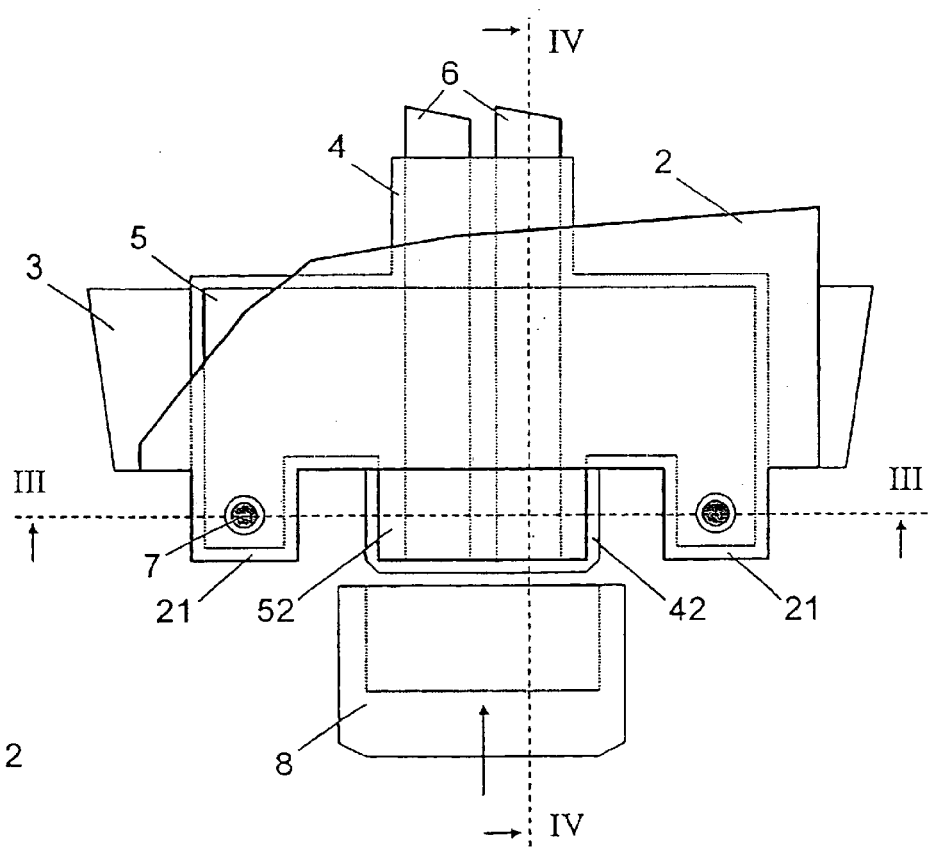
FIG. 2 shows part of a power semiconductor module according to FIG. 1, with the cover plate and a first embodiment of the printed circuit board.

FIG. 2 shows part of the power semiconductor module according to the invention as viewed from above.

The printed circuit board 4 that is metallized on both sides is arranged between the housing wall 3 and the cover plate 2. The cover terminal conductor 5 is situated on the upper side facing the cover plate. Two control terminal conductors 6 are situated on the lower side facing the housing wall.

Figure 3:
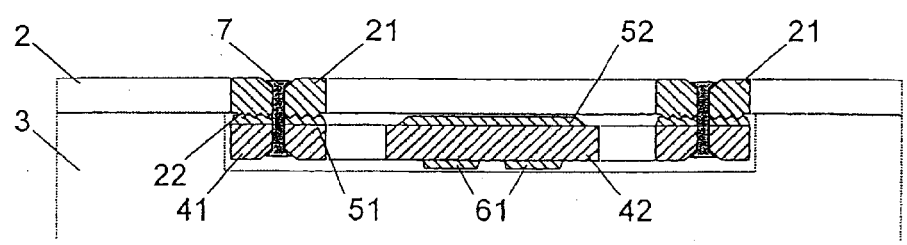
FIG. 3 shows a view of a section through the power semiconductor module according to FIG. 2 taken along III—III.

The cover plate 2 has two projections 21 projecting beyond the module housing edge. As can be seen from FIG. 3, the printed circuit board has two corresponding projections 41 arranged below the projections 21 of the cover plate. The projections 21 and 41 are connected to a fixing means 7, for example a rivet or a screw. An electrically conductive connection is thereby produced between the cover plate terminal conductor 51 arranged on the top side of the printed circuit board and the cover plate 21. A knurl 22 (roughened surface) is incorporated into the underside of the projection 21 of the cover plate. Pressing the tips of the knurl, which have a length of up to a few 100 μm, into the metallization of the printed circuit board results in an improved electrical connection.

Figure 4:
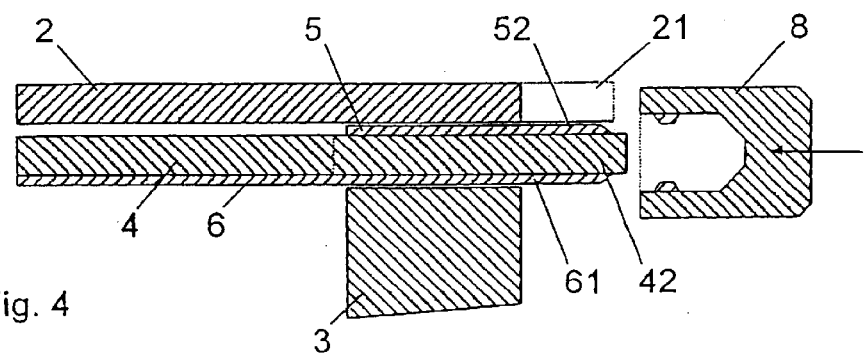
FIG. 4 shows a view of a section through the power semiconductor module according to FIG. 2 taken along IV—IV.

The printed circuit board has a further projection 42 between the two projections 41. Said projection 42 serves for accommodating a connector 8, as can be seen from FIG. 4. The connector 8 is pushed onto the projection 42 in the direction of the arrow. Contact elements arranged in the connector are pushed onto the terminals 52 and 61 arranged on both sides of the printed circuit board 4. Conventional printed circuit board connectors can be used as the connector.

The projection 42 is protected against impacts from above and from the side by the cover plate projections 21.

Figure 5:
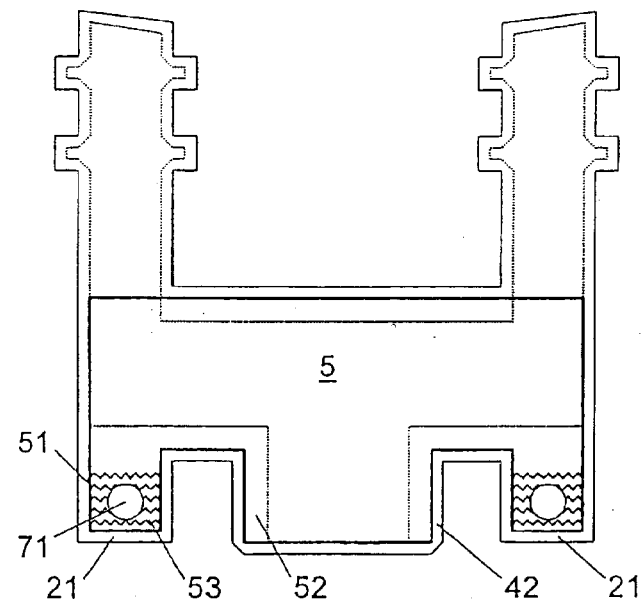
FIG. 5 shows a view from above of a second embodiment of the printed circuit board according to FIG. 2.
Figure 6:
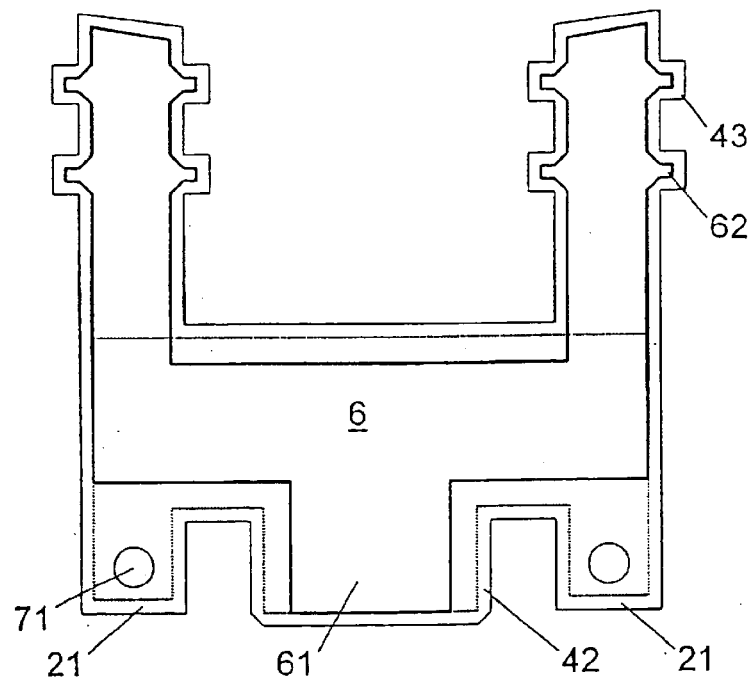
FIG. 6 shows a view from below of the printed circuit board according to FIG. 5.

FIG. 5 and FIG. 6 show a different embodiment of the printed circuit board with only one control terminal 61. Moreover, a knurl 53 is incorporated into the cover plate terminal conductor 51 in the region of the cutout 71 for the fixing means. The roughened surface results in an improved electrical connection with respect to the cover plate.

The printed circuit board comprises further projections 43 in the interior of the module housing, said further projections serving for the contact connection of the control busbar. Vertical contact elements (not shown) connect the control terminal conductor 62 to the busbar. Besides the cutouts 71 incorporated in the projections 21, it is possible to provide cutouts for further fixing means.

Besides the embodiments shown, it is conceivable to use a plurality of projections arranged one beside the other for a plurality of connectors. A cover plate projection for protecting the respective projection may in each case be provided between the individual connectors.

In addition, it is conceivable to provide more than one or two control terminals per printed circuit board projection.

In particular, exemplary embodiments with three- or multilayer printed circuit boards, in which each conductor layer comprises at least one terminal, are also conceivable.

List of Reference Symbols

1 Power semiconductor circuit
2 Conductive cover plate, emitter plate
3 Insulating housing
4 Insulating printed circuit board
5, 51 Cover plate terminal conductor
6, 62 Control terminal conductor
7 Fixing means
8 Terminal connector
9 Conductive baseplate
21, 41, 42, 43 Projection
22, 53 Knurl
52 Cover plate terminal
61 Control terminal
71 Cutout for fixing means

What is claimed is:

1. A power semiconductor module comprising a module housing having a conductive cover plate and a conductive baseplate, arranged essentially parallel to the cover plate, and also an insulating housing wall arranged between the cover plate and the baseplate, a power semiconductor circuit accommodated in the module housing and having at least two power terminals, of which one is electrically conductively connected to the cover plate and the other is electrically conductively connected to the baseplate, and at least two terminals of the power semiconductor circuit which are led out of the module housing, a first of the at least two terminals being provided for the contact connection of the cover plate, wherein a printed circuit board being formed in essentially planar fashion is led out of the module housing, the printed circuit board being formed in at least two layers, the two terminals being formed as conductors of the printed circuit board and the conductors being arranged essentially parallel to the planar areas of the printed circuit board and in that the printed circuit board is fixed to the cover plate by fixing means in a force-locking manner, so that the cover plate terminal conductor arranged on the side toward the cover plate is electrically conductively connected to the cover plate.

2. The power semiconductor module as claimed in claim 1, wherein the fixing means are arranged in the region of the contact connection location.

3. The power semiconductor module as claimed in claim 1, wherein the cover plate and/or the cover plate terminal conductor has a contact-optimizing knurl in the region of the contact connection location.

4. The power semiconductor module as claimed in claim 1, wherein the cover plate and the printed circuit board each have at least two projections wherein a projection of the cover plate and a projection of the printed circuit board are arranged one above the other, wherein the fixing means are arranged in the region of the projections wherein the printed circuit board has at least one further projection between the two projections and wherein the terminals are arranged on said further projection.

\* \* \* \* \*